US008367529B2

(12) United States Patent
Daudin et al.

(10) Patent No.: US 8,367,529 B2
(45) Date of Patent: Feb. 5, 2013

(54) METHOD FOR PREPARING A SEMICONDUCTOR

(75) Inventors: Bruno Daudin, La Tronche (FR); Henri Mariette, Grenoble (FR)

(73) Assignees: Commissariat a l'Energie Atomique, Paris (FR); Centre National de la Recherche Scientifique (CNRS), Paris (FR)

( * ) Notice: Subject to any disclaimer, the term of this patent is extended or adjusted under 35 U.S.C. 154(b) by 953 days.

(21) Appl. No.: 12/281,332

(22) PCT Filed: Mar. 6, 2007

(86) PCT No.: PCT/FR2007/000397
§ 371 (c)(1),
(2), (4) Date: Oct. 14, 2008

(87) PCT Pub. No.: WO2007/104848
PCT Pub. Date: Sep. 20, 2007

(65) Prior Publication Data
US 2011/0089445 A1    Apr. 21, 2011

(30) Foreign Application Priority Data
Mar. 8, 2006    (FR) ...................................... 06 02063

(51) Int. Cl.
*H01L 33/30*    (2010.01)
(52) U.S. Cl. .......... 438/510; 438/478; 438/483; 257/94; 257/615; 257/E21.135; 257/E21.09
(58) Field of Classification Search .................. 438/510, 438/478, 483; 257/94, 615, 201, E21.09, 257/E21.135, E29.089, E29.091, E33.023
See application file for complete search history.

(56) References Cited

U.S. PATENT DOCUMENTS

| 6,476,420 | B2 * | 11/2002 | Nikolaev et al. | 257/82 |
| 6,653,248 | B2 * | 11/2003 | Kean et al. | 438/22 |
| 6,713,789 | B1 * | 3/2004 | Shibata et al. | 257/103 |
| 2002/0053679 | A1 | 5/2002 | Nikolaev et al. | |
| 2002/0163008 | A1 * | 11/2002 | Northrup et al. | 257/102 |
| 2004/0173788 | A1 * | 9/2004 | Takizawa | 257/12 |

OTHER PUBLICATIONS

Takizawa T: "Novel method for the activation of acceptor dopant in AlN introducing localized band by isoelectronic dopant" GAN and Related Alloys—2003 Symposium (Mater. Res. Soc. Symposium Proceedings vol. 798) pp. 557-562 Mater. Res. Soc Warrendale, PA, USA 2004.

Zhang J-P et al: "p-Type co-doping study of GaN by photoluminescence", Journal of Cyrstal Growth, Feb. 1, 1999, pp. 368-371, vol. 197, No. 1-2, Elsevier, Amsterdam, NL.

(Continued)

*Primary Examiner* — Thinh T Nguyen
(74) *Attorney, Agent, or Firm* — Young & Thompson

(57) ABSTRACT

The invention concerns a method for preparing a NIII-V semiconductor. According to the invention, the method includes at least one step of doping a semiconductor of general formula $Al_xGa_{1-x}N$, wherein the atomic number x represents the number between 0 and 1 with a p-type electron-accepting dopant, as well as a co-doping step with a codopant capable of modifying the structure of the valency band. The invention also concerns a semiconductor as well as its use in electronics or optoelectronics. The invention further concerns a device as well as a diode using such a semiconductor.

15 Claims, 2 Drawing Sheets

OTHER PUBLICATIONS

Korotkov R Y et al: "Optical study of GaN:Mn co-doped with Mg grown by metal organic vapor phase epitaxy", Physica B. Condensed Matter, Dec. 2001, pp. 18-21, vol. 308-310, Amsterdam, NL.

Han B et al: "Optical properties of Mn4+ions in GaN:Mn codoped with Mg acceptors", Applied Physics Letters, American Institute of Physics, Jun. 17, 2004, pp. 5320-5322, vol. 84, No. 26, Melville, NY, US.

Van De Walle Chris G et al: "First-principle calculations for defects and impurities: Applications to III-nitrides", Journal of Applied Physics, American Institute of Physics, Apr. 15, 2004, pp. 3851-3879, vol. 95, No. 8, New York, US.

Korotkov R Y et al: "Codoping of wide gap epitaxial III-nitride semiconductors", Opto-Electronics Review Assoc. Polish Electrical Engineers, 2002, pp. 243-249, vol. 10, No. 4, Poland.

Kipshidze G et al: "Mg and 0 codoping in p-type GaN and AlxGal-xN", Applied Physics Letters, AIP, American Institute of Physics, Apr. 22, 2002, vol. 80, No. 16, Melville, NY, US.

Korotkov R Y et al: "Electrical properties of p-type GaN:Mg codoped with oxygen", Applied Physics Letters, AIP, American Institute of Physics, Jan. 8, 2001, vol. 78, No. 2, Melville, NY, US.

\* cited by examiner

METHOD FOR PREPARING A SEMICONDUCTOR

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates to a method for preparing a semiconductor, which will find its application in the electronic or optoelectronic industry.

More particularly, the invention relates to a method for preparing a III-V semiconductor of general chemical formula $Al_xGa_{1-x}N$, which will find its use in diodes.

2. Description of Related Art Including Information Disclosed Under 37 CFR 1.97 and 37 CFR 1.98

The production of light-emitting diodes (LED) is currently in full swing and numerous innovations have been brought since the appearance of diodes in the sixties. Indeed, quasi exponential growth, according to Craford's law, has been observed in luminous efficiency and has enabled to increase the value which was smaller than 0.2 lm/V during the appearance on the market up to more than 20 lm/W today, thus exceeding the efficiency of non-filtered filament lamps.

The technology supporting LED diodes rests with the properties of the semiconductors. Typically, an LED is formed of a semiconductor having regions with different conductivity: a first region abundant in electrons, so-called n-type, and a second one abundant in electronic gaps, so-called p-type. Most recent LEDs, although operating according to the same principle, may combine different semiconductors (heterojunction LED), wherein the general principle remains however the same. The movement of the load carriers, commonly named "carrier", electrons or holes, within the LED enables by re-combination to generate photons.

The luminous properties of a semiconducting material often rest with the defects and the impurities present within it. The use of dopants enables to bring particular quality to the material whereof they modify the composition; thus it is, in particular, possible to enrich the material with foreign matters so as to confer increased n- or p-character thereto.

Doping is however not easy and remains associated with different factors. It is recognized in particular that, for the family of the nitride semiconductors, and contrary to the n-type doping, the p-type doping is often difficult to carry out.

The solubility of the dopant, which corresponds to the maximum concentration that an impurity may reach in a thermodynamically balanced material, is highly linked with temperature and remains a significant limiting factor. The site occupied by the dopant within the material is not negligible and impacts in particular its energy as well as the electric properties of the material.

The occurrence of defects, such as gaps, self-interstitial atoms or antisites in the structure of the material increased complexity of the positioning possibilities for the dopant and concomitantly the variations in properties. Finally, the ionizing energy of the dopant, which enables determining the fraction of dopant which may play a carriers part, is, for its own as well, linked with temperature and impacts the properties quite considerably.

Nitrogen-containing III-V-type semiconductors have been studied extensively and seem to be best suited for light emission at green, blue and ultraviolet wavelengths (UV) which were not available at solid light emitters.

P-type doping of gallium nitride alloys GaN, aluminum nitride AlN and aluminum-gallium nitride $Al_xGa_{1-x}N$, when x varies between 0 and 1, is rather difficult due to the fact that the potential of the dopants used are highly accepting (Fischer and al-1995): Mg (220-250 meV), Zn (340 meV), Cd (550 meV), C (230 meV). This causes very low activation rate and, consequently, relatively low doping level (less than $10^{18}$ cm$^3$.

For instance, magnesium Mg, which is used universally for p-type doping of GaN and $Al_xGa_{1-x}N$ alloys, is situated 220 meV above the valency band of GaN, which leads to a typical 1%-activation rate at room temperature.

Theoretical calculations have shown that beryllium Be could be an efficient acceptor, with an activation energy around 60 meV (Bernardini and al 1997), Still, certain experiments have shown that the linking energy of Be is rather 240 meV (Nakano and al-2003), which makes Be as little interesting an element as a potential dopant.

The situation is even more dramatic in the case of AlGaN since it is known that the energy of certain acceptors, in particular Mg, becomes deeper and deeper in alloys with increasing Al content, turning these alloys into compounds which are difficult to be doped. This leads naturally to a limitation of their usage for the production of UV-type light-emitting diodes.

An approach to overcome the difficulties associated with p-type doping consists in co-doping Mg with oxygen 0, zinc Zn or with any other element, as described, for instance, by Korotkov et al 2001, Kipshidze et al 2002, Kim et al 2000) or still by Van de Waite et al 2004.

Even if a diminution in linking energy has been observed effectively when Mg was co-doped with 0, in practice this has not enabled to reach the doping levels desired.

Besides, attention should be drawn to the fact that co-doping is difficult to control since the ratio between the different codopants must be precise. For instance, it can be reminded that oxygen is a donor in GaN and that insufficient control in co-doping and oxygen content may lead very easily to undesirable n-type doping of the product.

Considering what was described above, it appears that efficient p-type doping of the GaN, AlN and $Al_xGa_{1-x}N$ alloys is on the agenda.

The aim of the present invention is to provide a method for preparing a III-V semiconductor which remedies the shortcomings aforementioned, in particular as regards their doping.

Another aim of the present invention is to provide in particular a p-type doping method of the semiconductors of the $Al_xGa_{1-x}N$ family.

Another aim of the present invention is to offer semiconductors capable of being used in the production of diodes, in particular light-emitting diodes in the UV ultraviolet zone.

Another aim of the present invention is to offer semiconductors capable of being used in the electronic or optoelectric industry.

Other aims and advantages of the invention will appear in the following description, which is given only by way of example and without being limited thereto.

BRIEF SUMMARY OF THE INVENTION

The invention relates to a method for preparing a III-V semiconductor.

According to the invention, said method includes at least one step of doping a semi-conductor of general formula $Al_xGa_{1-x}N$, wherein the atomic number x represents a number ranging between 0 and 1, with a p-type electron-accepting dopant, as well as a co-doping step with a codopant capable of modifying the structure of the valency band.

The invention relates moreover to a semiconductor obtained by the method described in the present invention.

The invention also relates to the use of such a semiconductor in the electronic or optoelectronic industry.

The invention relates besides to an electronic device implementing a semiconductor according to the invention, as well as electronic device including a heterostructure of III-N semiconductors including:
 a substrate;
 an n-doped zone;
 an active zone;
 a p-doped zone; and
 electric contacts, one on the n-zone the other on the p-zone,
  wherein each of these contact is connected to the terminals of a current or voltage source, characterized in that with the p-doped zone is a semiconductor obtained by the method aforementioned according to the invention.

The invention also relates to a light-emitting diode including a heterostructure as described in the present invention.

BRIEF DESCRIPTION OF THE SEVERAL VIEWS OF THE DRAWINGS

The invention will be understood better when reading the following description accompanied by the appended drawings.

DETAILED DESCRIPTION OF THE INVENTION

Figure 1:
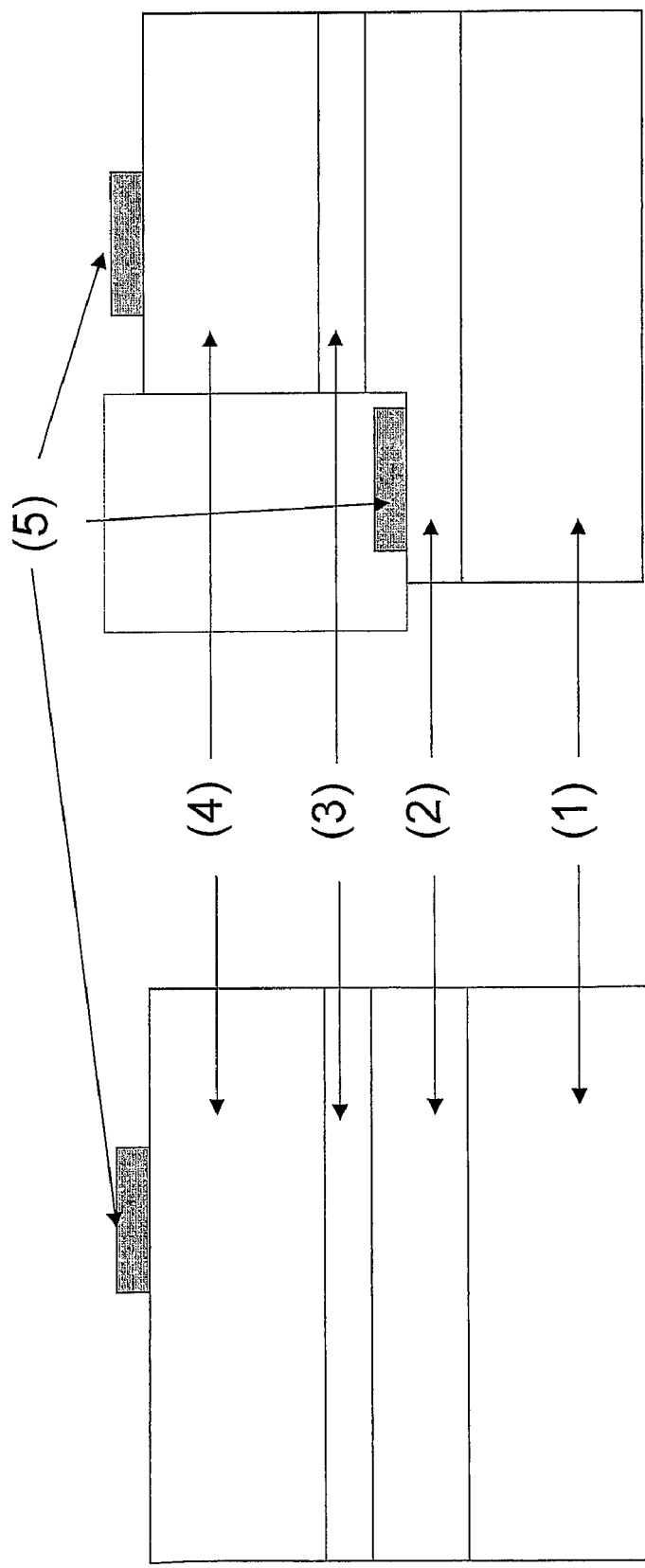
FIGS. 1a and 1b represent a schematic view of a diagram of an optoelectronic device of the present invention.

The present invention relates to a method for preparing a III-V semiconductor.

More accurately, according to the invention, said method includes at least one step of doping a semi-conductor of general formula $Al_xGa_{1-x}N$, wherein the atomic number x represents a number ranging between 0 and 1, with a p-type electron-accepting dopant, as well as a co-doping step with a codopant capable of modifying the structure of the valency band.

Typically the atomic density, corresponding to a number of atoms per unit volume, will be of the order of $10^{22}$ atoms·cm³ of the species affected. The preferred semiconductors are those for which x is greater than or equal to 0.2 and preferably 0.25. Beyond this value, conventional doping methods, such as simple doping with Mg, start to be less efficient.

According to another embodiment the co-doping step is performed with a codopant in particular selected among the isoelectronic impurities of the semiconductor of general formula $Al_xGa_{1-x}N$.

The III-V semiconductors affected particularly are the solid solutions formed after doping of at least 90% of a mixture of AlN and GaN over the whole composition range. Preferably, the proportion will be greater than or equal to 98%.

In the sense of the present invention, a dopant or a codopant are chemical species different from those constitutive of the non-doped semiconductor and accounting for less than 10% of the quantity of atoms present in the doped semiconductor, preferably less than 2%. Typically, the atomic density of these species within a doped semiconductor is always of the order of $10^{17}$ to $10^{20}$ atoms·cm³.

According to the invention any p-type dopant, i.e. any electron-accepting dopant, such as zinc Zn, beryllium Be or still carbon C, may be used. The use of magnesium Mg or of manganese Mn is particularly advantageous.

The codopant will be selected preferably among isoelectronic impurities of the semiconductor to be doped. In the sense of the present invention, an isoelectronic impurity refers to any element capable of modifying the valency band structure so that the modification of the energy of the valency band leads to relative lowering of the energy of the p-type dopant in the forbidden energy band. According to the inventors, the members belonging to column V of the periodic table are particularly suited.

Among the members of column V, arsenic As may be mentioned, which is the preferred isoelectronic impurity. The concentration of the codopant in the doped semiconductor is preferably smaller than 10%, advantageously smaller than 6%.

In order to determine the structure variation of the band, optical absorption measurements may be conducted. The optimal proportion of the codopant, such as As, is that corresponding to the solubility limit in the semiconductor, of the order of 5% in the doped semiconductor, so as to ensure incorporation in substitutional site.

According to a first embodiment, doping and co-doping are performed simultaneously during the growth of the semiconductor. The growth techniques employed in the field and known to the man of the art are useable according to the invention.

It is desirable to integrate the dopant and the codopant in the flow of elements in addition to the elements used for the growth of the semiconductor of general formula $Al_xGa_{1-x}N$. More precisely, the molecular beam epitaxy method (MBE) consists of the synthesis of a material whereof the flows of the different components, each generated by a specific cell, are sent independently from one another on a suitable substrate.

These different cells are mounted in a chamber where ultra vacuum conditions prevail, typically a few $10^{-9}$ Torr's, in the absence of growth, wherein the growing pressure depends on the material and varies between $10^{-8}$ and $10^{-4}$ Torrs.

An MBE method for growing semiconductors thus includes usually solid sources, typically cells of gallium Ga, aluminium Al, iridium In, silicon Si (for n-type doping), magnesium Mg or manganese Mn (for p-type doping), as well as a cell for the production of atomic nitrogen by dissociation of gaseous nitrogen or of ammoniac.

Obviously, other solid sources may be provided for doping or co-doping and the above list is not exhaustive. During growth, the substrate is raised to high temperature. However, it should be noted that this temperature is vastly smaller than that of the thermodynamic balance of the material. The MBE growth takes place rather far from the thermodynamic balance.

In a second embodiment, doping is realized, generally by implantation, after the growth of the semiconductor of general formula $Al_xGa_{1-x}N$. The co-doping step may in such a case be performed simultaneously to the doping step or then during the growth of the semiconductor and in such a case the doping step will be performed after the co-doping step.

The latter method is particularly suited since it exhibits the advantage of an excellent control of the dose and, to a certain extent, enables certain spatial selectivity of doping. Conversely, doping by implantation is considered as a source of defects.

These implantation defects are suppressed advantageously by annealing at a temperature lower than that of the decomposition of deposited material, i.e. lower than that of its fusion or of its sublimation, as the case may be. The metalorganic chemical vapour deposition (MOCVD) is similar to the MBE method in its results but differs substantially from a technical viewpoint: the chamber is not maintained under ultra vacuum, the sources of the individual chemical elements are—as the name says—metalorganic compounds.

An MOGVD method thus includes as many gas lines as compounds necessary to the growth, including dopants and codopant. It also comprises one or several "carrier" gas lines, either hydrogen H or nitrogen N, which does not partake directly of the growth but is used for transporting reactive gases. The temperature during growth is higher than in the MBE method but remains smaller than that of the thermodynamic balance.

The quantity of p-type dopant introduced in the semiconductor is adapted to the application contemplated. Thus, for instance, for an LED diode, it is typically of the order of $10^{19}$ to $10^{20}$ atomscm-$^3$. Generally the quantity of dopant exhibits in the doped semiconductor represents approximately 1% of the atoms.

The quantity of codopant is delineated by the solubility of the codopant in the semiconducting material, besides it is preferably greater than that of the dopant. Thus, in the case of As, the quantity present in the doped semiconductor represents less than 5% of the atoms and advantageously less than 2%. Typically, it is of the order of $5 \cdot 10^{20}$ atoms/cm$^3$.

The thickness of the doped semiconductor is generally of the order of the micron for most applications, in particular in the case of LEDs where it does not exceed 5 microns typically.

The present method has in particular the effect of diminishing the ionizing energy of the dopant, which is one of the key factors for mastering the properties of the semiconductors, and thus enables to increase considerably the number of carriers available within the material.

The method, as described in the present invention, includes preferably a step of growing the semiconductor of general formula $Al_xGa_{1-x}N$ from a starting substrate normally used in the field and selected advantageously among aluminium oxide $Al_2O_3$, silicon Si, silicon carbide SiC, zinc oxide ZnO, gallium arsenide GaAs or other substrates enabling coherent growth of gallium nitride GaN or monocrystalline $Al_xGa_{1-x}N$.

It should be noted that these substrates may exhibit varied crystallographic orientations enabling the growth of GaN also according to varied orientations. A stack of different thin layers of semiconductors may be deposited on the substrate, mainly by metalorganic chemical vapour deposition (MOCVD) or by molecular beam epitaxy (MBE). As a layer of $Al_xGa_{1-x}N$ is necessary and included in the assembly, the layers may successively be piled up regardless of the method employed, their thickness remaining also user-controlled in relation to the objective of the user.

Different samples of GaN are prepared on a substrate of GaAs, of sapphire ($Al_2O_3$) or of SiC, by the same MBE or MOCVD technique. Doping, by implantation after GaN deposition or then simultaneously, is realised over a portion of the samples with Mn so that its concentration is smaller than 5%, annealing enables to suppress possible defects, in the case of implantation doping.

The optical absorption energy of the samples, doped or not, prepared from a SIC or sapphire substrate is similar to that of the gap. It appears however that p-doping level of the Mn-doped GaN deposited on GaAs is greater than $10^{16}$ atoms·cm-$^3$ at room temperature and that the activation energy of the acceptor is of the order of 45 to 60 meV (Edmonds et coil., Appl. Phys. Lett, 86, 152114, 2005), which is significantly lower than the 1000 meV observed generally.

The analysis of the sample shows that arsenic diffuses passively in the GaN layer from the GaAs substrate.

It appears hence that the simultaneous presence of As and Mn enables on its own to reach the high doping level observed. The variation in doping efficiency is linked with the presence of As which modifies locally the electronics structure of GaN or of the AlGaN alloys, as proven by the optical absorption results and states below the gap then put in evidence.

The implementation of an Mn/As co-doping, and more generally of a P-type dopant and of an isoelectronic impurity, in the preparation of the semiconductors of general formula $Al_xGa_{1-x}N$ enables to solve the recognized difficulties of p-doping. An identical protocol may be implemented as regards the other p-dopants of nitrides: essentially Mg but also Zn, Be, C for instance.

Co-doping may be realized independently by the MBE or MOCVD method, known to the man of the art, before or during doping. The quantity of introduced codopant is typically greater than that of the dopant and the maximal value is equal to the solubility of the codopant in the semiconductor of general formula $Al_xGa1$ A diode, as represented on FIG. 2, may thus be manufactured from a stack of different layers of semiconductors, doped or not. The growth substrate is an advantageously transparent semiconductor as $Al_2O_3$, the thickness of the substrate is the order of a few hundred microns. The growth of the doped semiconductor is realized independently by the MBE or MCOVD method, so that the semiconductor is formed of 94% of a mixture of AlN and of GaN, of 5% As and approximately 1% Mg, Mn or of any other p-type dopant.

For ensuring optimal light extraction, the diode is turned over relative to the substrate and transferred by a submount enabling contacting the p-side and the n-side with metallic electrodes. The photons transmitted in the active zone (the dotted line) are either transmitted directly upwards through the $Al_2O_3$ substrate, or reflected at the interface with the metallic electrode used for contact and returned upwards.

The object of the present invention also extends to the semiconductors obtained by any of the processes exposed above and to their use in any type of industry, more particularly in electronics and optoelectronics and, in particular, in the automotive industry, road signalling, household lighting and nitride semiconductor based lasers.

More particularly, the object of the present invention concerns a doped semiconductor including at least 90% of a mixture of AlN and of GaN.

Moreover, the present invention concerns a doped semiconductor including at least 98% of a mixture of AlN and of GaN.

Moreover, the present invention relates to a semiconductor characterised in that the p-type dopant is in particular selected among Zn, Be, C, Mg or Mn.

Besides, the present invention relates to a doped semiconductor characterized in that it is co-doped by an isoelectronic impurity of one of the atoms forming the non-doped semiconductor.

The present invention also relates to a doped semiconductor which is co-doped by an isoelectronic impurity corresponding to an element of column V of the periodic table and, advantageously, As.

The invention also corresponds to electronic and optoelectronic devices implementing the doped semiconductors presented above. An electronic device according to the invention, and as shown on FIGS. 1a and 1b, contains in particular a heterostructure of III-N semiconductors, said heterostructure including:

a substrate 1;
an n-doped zone 2, formed in particular of n-GaN and of n-AlGaN;
an active zone 3;
a p-doped zone 4, formed of a doped semiconductor as defined above, in particular p-GaN and p-AlGaN, co-doped with an isoelectronic impurity such as As; and
electric contacts 5, one on the n-zone the other on the p-zone, wherein each of these contact is connected to the terminals of a current or voltage source, which may in particular be a simple pile. The p-doped zone is a semiconductor obtained by the method described above.

Figure 2:
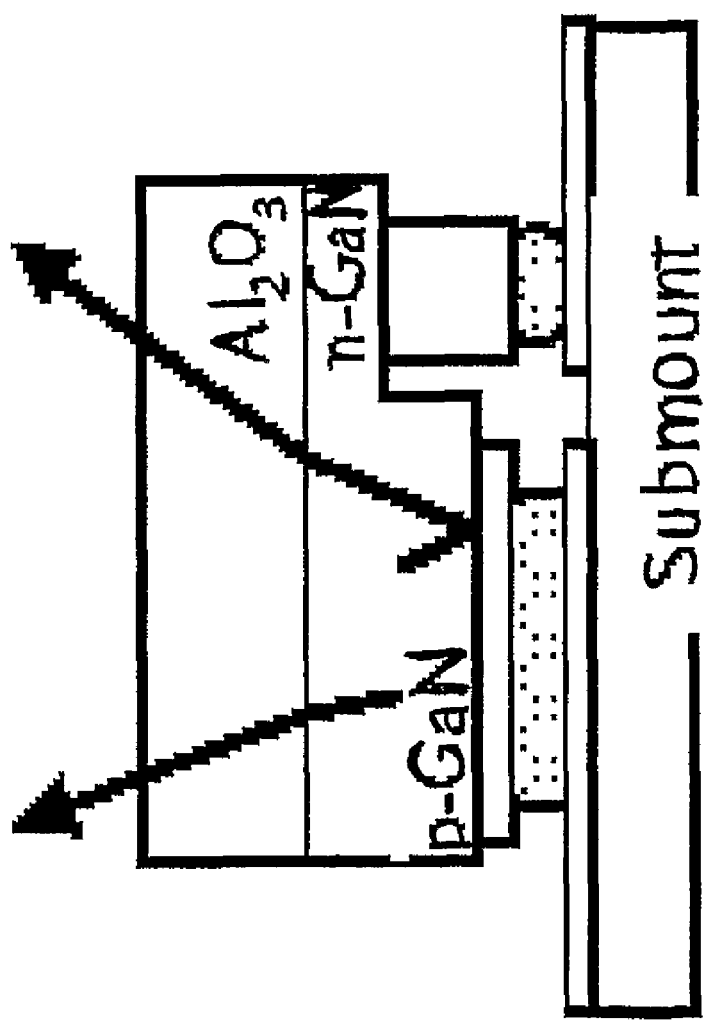
FIG. 2 represents a schematic view of a diagram of an LED according to the invention.

The invention also relates to a light-emitting diode (LED), as shown on FIG. 2, including a heterostructure as described previously.

Naturally, other embodiments, understandable to the man of the art, may be contemplated without departing from the framework of the invention.

We claim:

1. A method for preparing a III-V semiconductor, said method comprising the steps of:
doping a semi-conductor of general formula $Al_xGa_{1-x}N$, wherein atomic number x represents a number ranging between 0 and 1, with a p-type electron accepting dopant selected from the group consisting of manganese Mn and magnesium Mg; and
co-doping with As, wherein the As has a concentration corresponding to a solubility limit in the semi-conductor.

2. The method according to claim 1, wherein the atomic number x is greater than or equal to 0.2.

3. The method according to claim 1, wherein the semiconductor contains at least 90% of a mixture of AlN and GaN.

4. The method according to claim 1, wherein the semiconductor contains at least 98% of a mixture of AlN and GaN.

5. The method according to claim 1, wherein the As has a concentration smaller than 10%.

6. The method according to claim 1, wherein the doping and co-doping steps are performed simultaneously.

7. The method according to claim 1, wherein the doping step is performed after the co-doping step.

8. The method according to claim 1, further comprising the step of:
growing the semiconductor from a substrate selected from the group consisting of $Al_2O_3$, Si, SiC, ZnO, and GaAs.

9. A semiconductor obtained by the method according to claim 1.

10. The semiconductor according to claim 9, containing at least 90% of a mixture of AlN and GaN.

11. The semiconductor according to claim 9, containing at least 98% of a mixture of AlN and GaN.

12. The method comprising:
using a semiconductor according to claim 9 in the electronic or optoelectronic industry.

13. An electronic device comprising:
a semiconductor according to claim 9.

14. An electronic device comprising:
a substrate (1);
an n-doped zone (2);
an active zone (3);
a p-doped zone (4); and
electronic contacts (5), one on the n-zone, the other on the p-zone, wherein each contact is connected to the terminals of a current or voltage source, and wherein said p-doped zone is a semi-conductor obtained by the method according to claim 1.

15. A light-emitting diode comprising:
a heterostructure according to claim 14.

* * * * *

UNITED STATES PATENT AND TRADEMARK OFFICE
CERTIFICATE OF CORRECTION

PATENT NO.        : 8,367,529 B2                                                            Page 1 of 1
APPLICATION NO.   : 12/281332
DATED             : February 5, 2013
INVENTOR(S)       : Daudin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1077 days.

Signed and Sealed this
First Day of September, 2015

Michelle K. Lee
*Director of the United States Patent and Trademark Office*